(12) United States Patent
Yukawa

(10) Patent No.: US 8,319,167 B2
(45) Date of Patent: Nov. 27, 2012

(54) SOLID STATE IMAGING DEVICE AND ELECTRONIC APPARATUS

(75) Inventor: Hiroaki Yukawa, Kanagawa (JP)

(73) Assignee: Sony Corporation (JP)

( * ) Notice: Subject to any disclaimer, the term of this patent is extended or adjusted under 35 U.S.C. 154(b) by 493 days.

(21) Appl. No.: 12/657,991

(22) Filed: Jan. 29, 2010

(65) Prior Publication Data

US 2010/0200730 A1 Aug. 12, 2010

(30) Foreign Application Priority Data

Jan. 30, 2009 (JP) .............................. P2009-019500

(51) Int. Cl.
*H01L 31/0232* (2006.01)
*H01L 27/146* (2006.01)

(52) U.S. Cl. .................................... 250/208.1; 257/292

(58) Field of Classification Search ............... 250/208.1, 250/237 R, 237 G, 227.2; 257/292, 184, 257/187, 461, 506
See application file for complete search history.

(56) References Cited

U.S. PATENT DOCUMENTS

| | | | |
|---|---|---|---|
| 7,018,749 B2 * | 3/2006 | Taniguchi | 257/E21.134 |
| 7,196,365 B2 | 3/2007 | Yamamura | |
| 7,379,175 B1 * | 5/2008 | Stokowski et al. | 356/237.5 |
| 2004/0000669 A1 | 1/2004 | Yamamura | |
| 2004/0066569 A1 * | 4/2004 | Taniguchi | 359/883 |
| 2007/0075343 A1 | 4/2007 | Yamamura | |

FOREIGN PATENT DOCUMENTS

| | | | |
|---|---|---|---|
| JP | 2000 150845 A | 5/2000 |
| JP | 2002 359363 A | 12/2002 |
| JP | 2003 324189 A | 11/2003 |
| JP | 2004 221532 A | 8/2004 |
| JP | 2005 294749 A | 10/2005 |
| JP | 2006 086320 A | 3/2006 |

* cited by examiner

*Primary Examiner* — Seung C Sohn
(74) *Attorney, Agent, or Firm* — Lerner, David, Littenberg, Krumholz & Mentlik, LLP

(57) ABSTRACT

A solid state imaging device includes: a sensor unit that has a semiconductor substrate in which pixels including photoelectric conversion parts are disposed in an array on a light receiving surface; a lens module which has a plurality of optical members including a lens and which is disposed such that light including information on an image to be imaged is incident on the light receiving surface of the sensor unit; and a phase shift mask in which regions for dividing all light beams into a plurality of groups are set and which makes a different phase shift occur in each of the regions for the light.

8 Claims, 20 Drawing Sheets

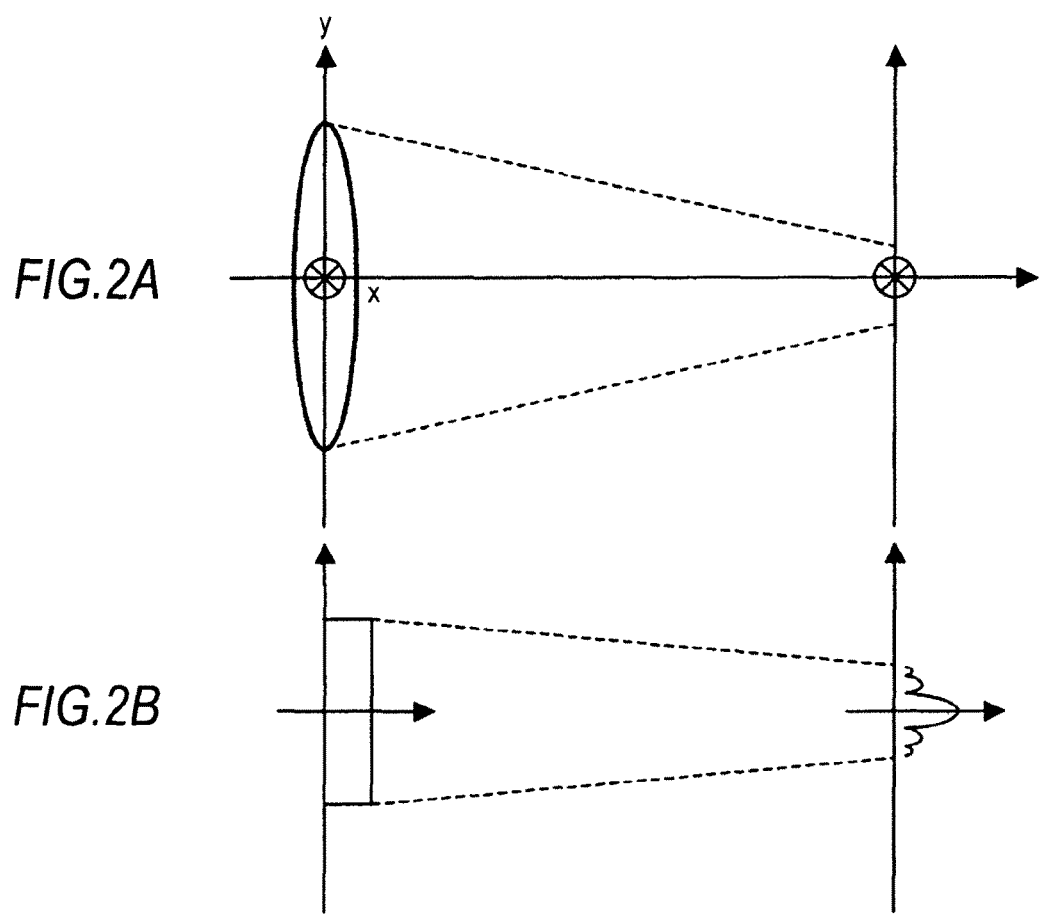

FIG.10A
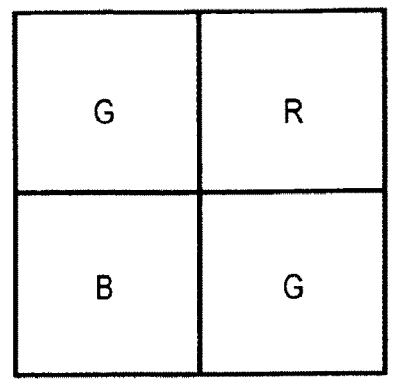
FIG.10B  G:
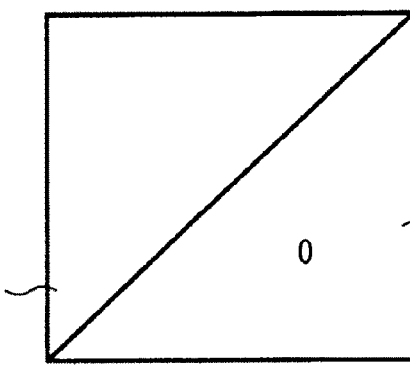
FIG.10C  B:
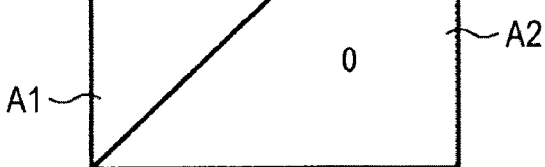
FIG.10D  R:
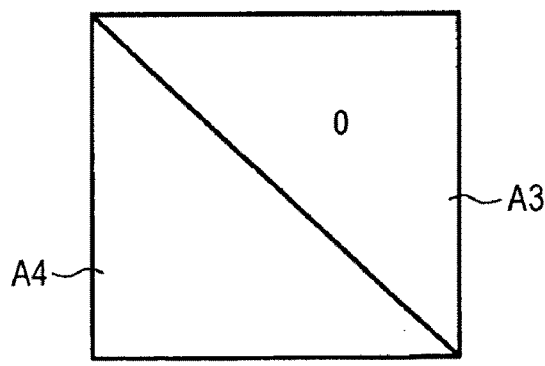

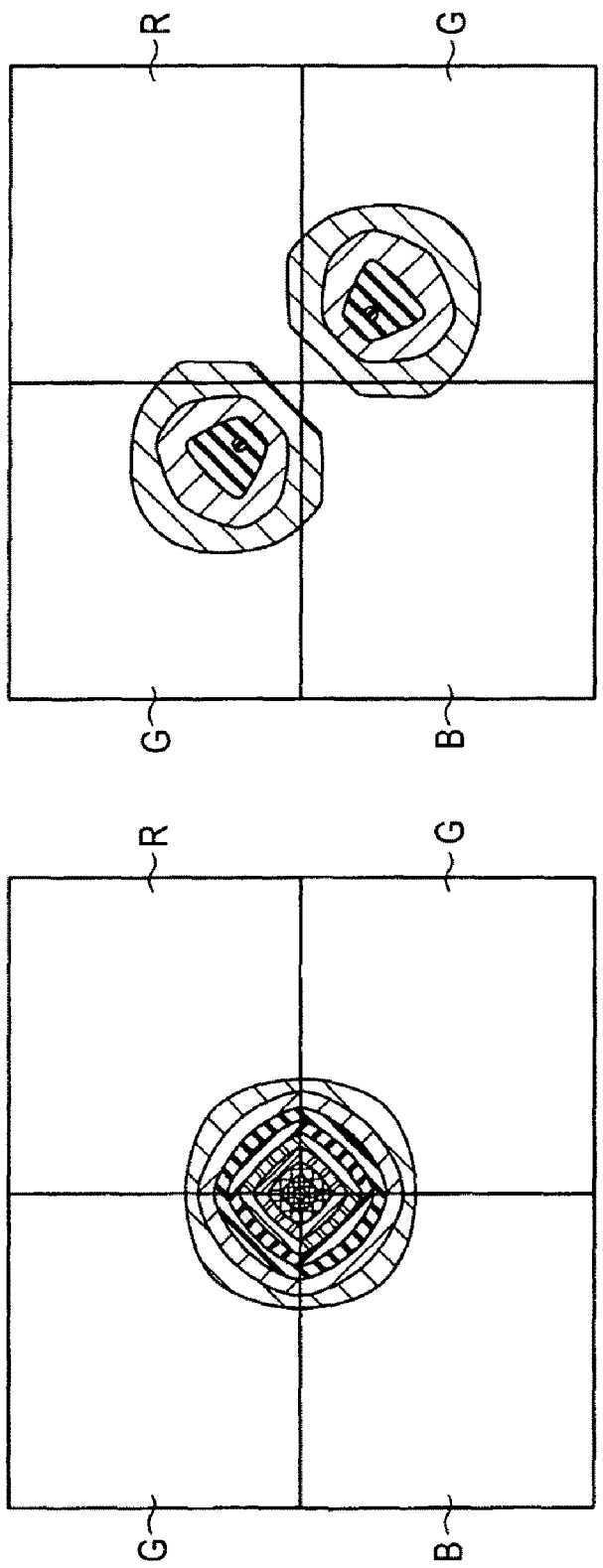

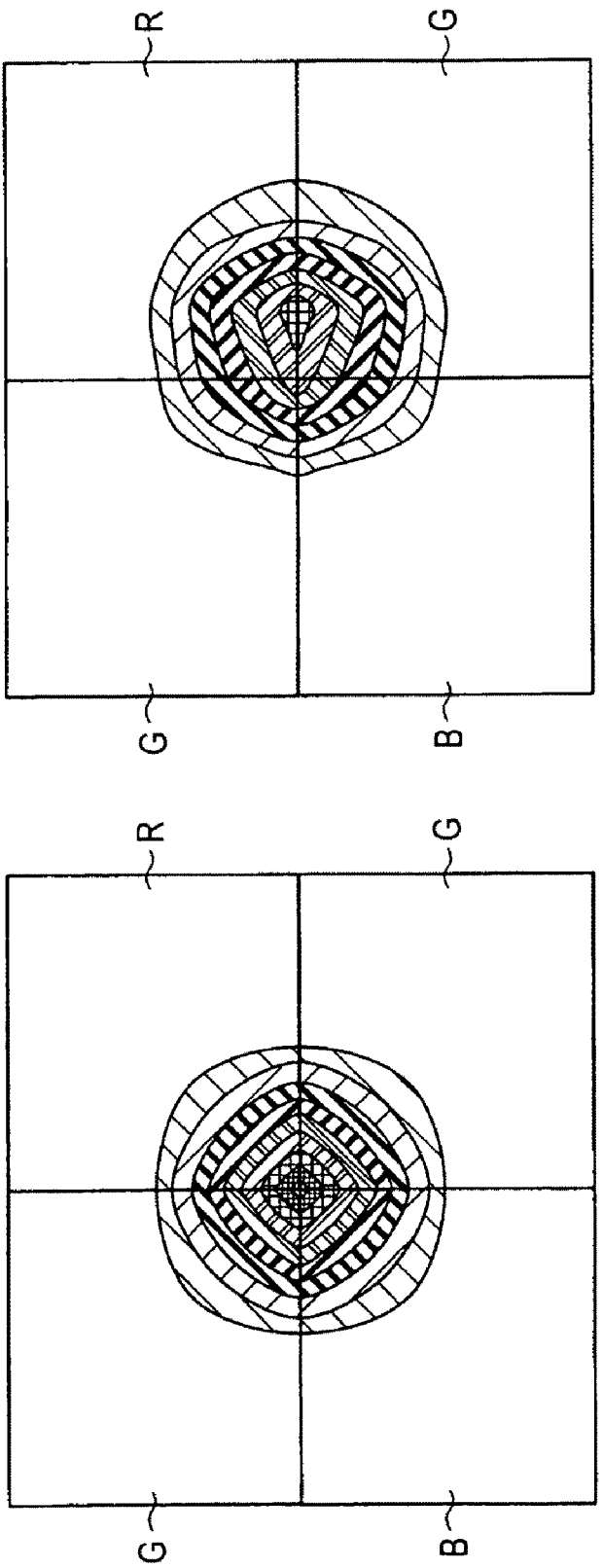

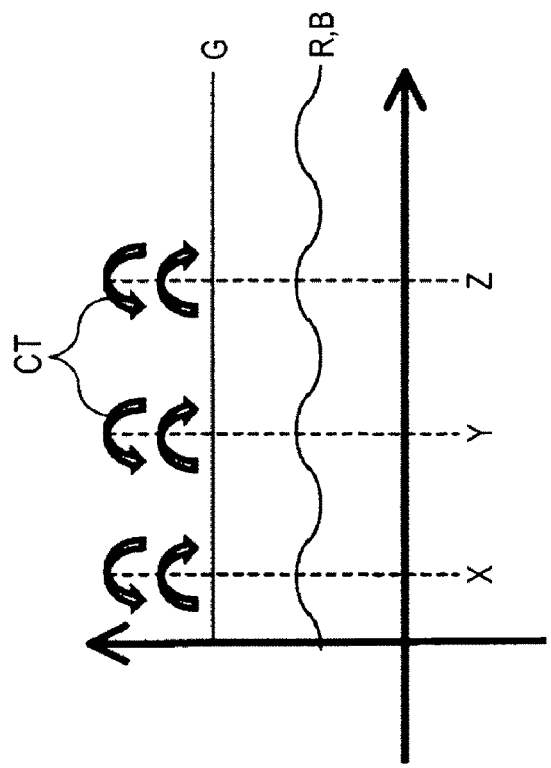
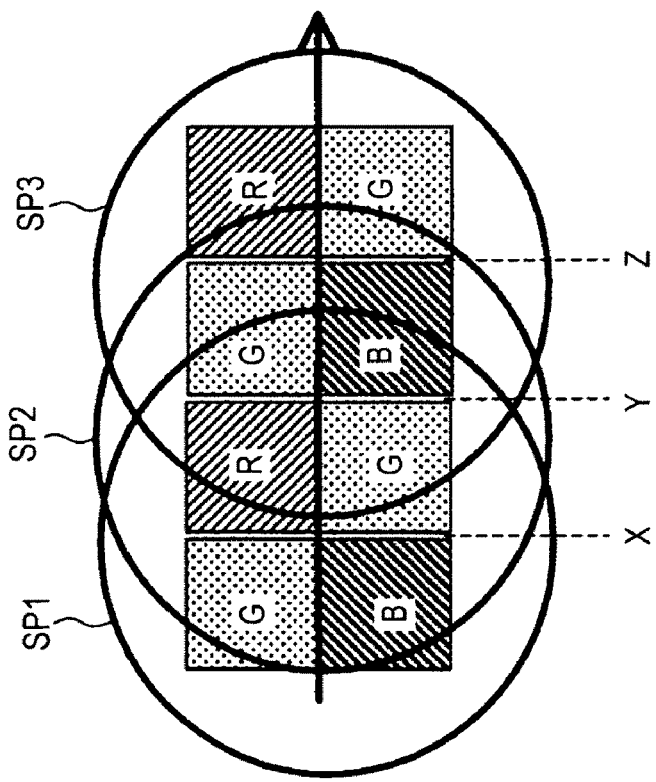
FIG.15A
FIG.15B

SOLID STATE IMAGING DEVICE AND ELECTRONIC APPARATUS

CROSS-REFERENCE TO RELATED APPLICATION

The present application claims priority from Japanese Patent Application No. JP 2009-019500 filed in the Japanese Patent Office on Jan. 30, 2009, the entire content of which is incorporated herein by reference.

BACKGROUND OF THE INVENTION

1. Field of the Invention

The present invention relates to a solid state imaging device and an electronic apparatus and in particular, to a solid state imaging device in which pixels having photoelectric conversion parts are arrayed in a matrix on a light receiving surface and an electronic apparatus including the solid state imaging device.

2. Description of the Related Art

As a solid state imaging device, a CMOS (Complementary MOS) sensor or a CCD (Charge coupled device) is known, for example.

The solid state imaging device, such as the CMOS sensor or the CCD sensor, is configured such that light is incident on a photodiode (photoelectric conversion section) formed on a surface of a semiconductor substrate and an image signal is acquired by a signal charge generated in the photodiode.

In the CMOS sensor, for example, a photodiode is provided for every pixel arrayed in a two-dimensional matrix on the light receiving surface. A signal charge generated and accumulated in each photodiode when light is received is transferred to the floating diffusion by driving of a CMOS circuit. The signal charge is converted into a signal voltage and is read.

Moreover, in the CCD sensor, for example, a photodiode is provided for every pixel arrayed in a two-dimensional matrix on the light receiving surface similar to the CMOS sensor. A signal charge generated and accumulated in each photodiode when light is received is transferred through a CCD vertical transfer path and a CCD horizontal transfer path and is read.

FIG. 19 is a view showing the schematic configuration of an example of a solid state imaging device in the related art. The imaging device includes a sensor unit 101 and a lens module 102, for example.

The sensor unit 101 has a substrate 111 in which, for example, CMOS or CCD type pixels are disposed in an array and an insulating layer 112 formed on the substrate 111. A metal wiring line and an optical waveguide are formed in the insulating layer 112.

In addition, a color filter 113, such as a red (R) color filter, a green (G) color filter, and a blue (B) color filter, is provided on the insulating layer 112 and an on-chip microlens 114 is provided on the color filter 113. The on-chip microlens 114 and the optical waveguide improve the efficiency when light incident on the sensor unit 101 is incident on a pixel.

The lens module 102 includes a plurality of optical members, such as first to fifth lenses 121 to 125 and an optical member 126.

The lens module 102 is designed such that light forms an optimal spot on the sensor unit 101 in consideration of tolerance, dependency of the angle of view, and the like of light incident on the sensor unit 101.

FIG. 20 shows an example of the layout of pixels seen from the light incidence side (on-chip microlens side) of the sensor unit 101.

For example, as shown in the drawing, "2×2" pixels are set as one pixel unit PU, and two green (G) pixels are disposed in one diagonal direction and one red (R) pixel and one blue (B) pixel are disposed in the other diagonal direction.

In the sensor unit 101 with the above configuration, light, which is incident on a pixel of each color in a certain pixel unit in a state of proper focusing, is incident on a pixel of an adjacent pixel unit when the state changes to a defocus state for setting of a lens module or the like. This is so-called crosstalk, and this causes deterioration of the quality of an image.

Solid state imaging devices in the related art are disclosed in JP-A-2000-150845, JP-A-2002-359363, JP-A-2003-324189, JP-A-2004-221532, JP-A-2005-294749, and JP-A-2006-86320.

SUMMARY OF THE INVENTION

In view of the above, it is desirable to propose a technique of suppressing crosstalk occurring when incident light is defocused in a solid state imaging device.

According to an embodiment of the present invention, there is provided a solid state imaging device including: a sensor unit that has a semiconductor substrate in which pixels including photoelectric conversion parts are disposed in an array on alight receiving surface; a lens module which has a plurality of optical members including a lens and which is disposed such that light including information on an image to be imaged is incident on the light receiving surface of the sensor unit; and a phase shift mask in which regions for dividing all light beams into a plurality of groups are set and which makes a different phase shift occur in each of the regions for the light.

The solid state imaging device according to the embodiment of the present invention includes the sensor unit, the lens module, and the phase shift mask.

The sensor unit has the semiconductor substrate in which pixels including photoelectric conversion parts are disposed in an array on the light receiving surface.

The lens module has a plurality of optical members including a lens and is disposed such that light including the information on an image to be imaged is incident on the light receiving surface of the sensor unit.

The phase shift mask has the regions set to divide all light beams into a plurality of groups and makes a different phase shift occur in each of the regions for the light.

Furthermore, according to another embodiment of the present invention, there is provided an electronic apparatus including: a sensor unit that has a semiconductor substrate in which pixels including photoelectric conversion parts are disposed in an array on a light receiving surface; an optical system including a lens module, which has a plurality of optical members including a lens and which is disposed such that light including information on an image to be imaged is incident on the light receiving surface of the sensor unit, and a phase shift mask in which regions for dividing all light beams into a plurality of groups are set and which makes a different phase shift occur in each of the regions for the light; and a signal processing circuit which processes an output signal of the sensor unit.

The electronic apparatus according to the embodiment of the present invention includes the sensor unit, the optical system, and the signal processing circuit for processing the output signal of the sensor unit. Here, the sensor unit and the optical system are configured to include the solid state imaging device according to the embodiment of the present invention.

The solid state imaging device according to the embodiment of the present invention can suppress crosstalk occurring when incident light is defocused in the solid state imaging device.

The electronic apparatus according to the embodiment of the present invention can suppress crosstalk occurring when incident light is defocused at the time of imaging.

BRIEF DESCRIPTION OF THE DRAWINGS

FIGS. 2A and 2B are views showing the relationship between the amplitude distribution on a lens surface and the amplitude distribution on a focal plane in the solid state imaging device according to the first embodiment of the present invention;

FIG. 10A is a view showing an example of the pixel layout;

FIGS. 10B to 10D are views showing the phase differences which effectively occur for green (G) light, blue (B) light, and red (R) light, respectively;

FIG. 11A is a view showing a beam pattern on the light receiving surface at a wavelength of 550 nm (green light) when there is no phase shift mask;

FIG. 11B shows a beam pattern on the light receiving surface at a wavelength of 550 nm (green light) when a phase shift mask is provided;

FIG. 13A is a view showing a beam pattern on the light receiving surface at a wavelength of 650 nm (red light) when there is no phase shift mask;

FIG. 13B shows a beam pattern on the light receiving surface at a wavelength of 650 nm (red light) when a phase shift mask is provided;

FIGS. 15A and 15B are views for explaining the effects of the second embodiment of the present invention;

DESCRIPTION OF THE PREFERRED EMBODIMENTS

Hereinafter, a solid state imaging device and an electronic apparatus including the solid state imaging device according to embodiments of the present invention will be described with reference to the accompanying drawings.

First Embodiment

Figure 1:
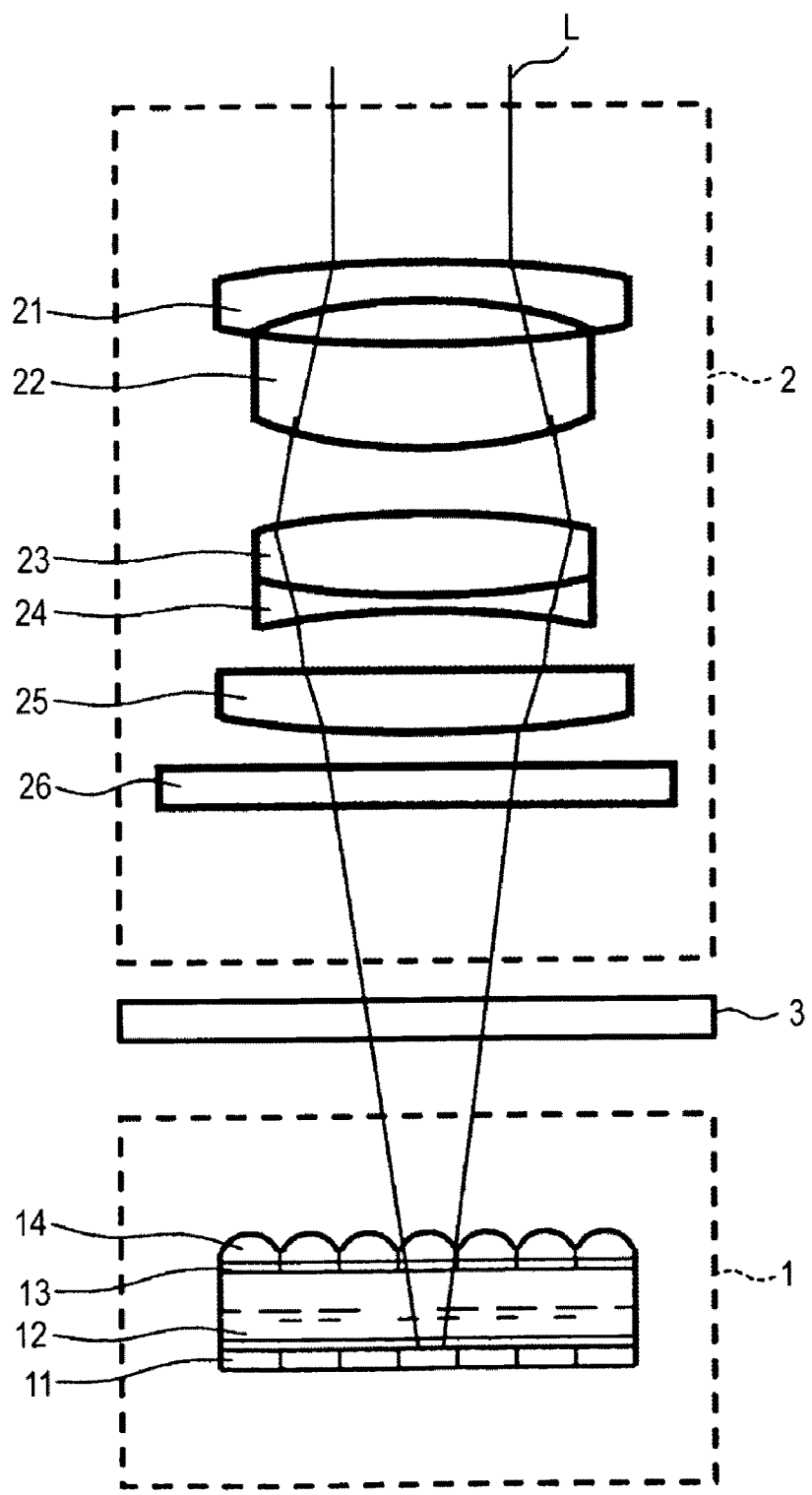
FIG. 1 is a view showing the schematic configuration of a solid state imaging device according to a first embodiment of the present invention.

FIG. 1 is a view showing the schematic configuration of a solid state imaging device according to the present embodiment.

For example, the solid state imaging device includes a sensor unit 1, a lens module 2, and a phase shift mask 3 disposed between the sensor unit 1 and the lens module 2.

The sensor unit 1 has a semiconductor substrate 11 in which CMOS or CCD type pixels including photodiodes are disposed in an array, for example.

Moreover, for example, an insulating layer 12 is formed on the semiconductor substrate 11 and a metal wiring line, an optical waveguide, and the like are provided in the insulating layer 12.

In addition, for example, a color filter 13, such as a red (R) color filter, a green (G) color filter, and a blue (B) color filter, is provided on the insulating layer 12 and an on-chip microlens 14 is provided on the color filter 13.

The on-chip microlens 14 and the optical waveguide improve the efficiency when light incident on a pixel of the semiconductor substrate 11 is incident on a pixel.

The lens module 2 includes a plurality of optical members, such as first to fifth lenses 21 to 25 and an optical member 26.

The lens module 2 is designed such that light including the information on an image, which is to be imaged, is incident on a light receiving surface of the sensor unit and forms an optimal spot on the sensor unit 1 in consideration of tolerance, dependency of the angle of view, and the like of incident light L to the sensor unit 1.

Here, the solid state imaging device according to the present embodiment further includes the phase shift mask 3.

The phase shift mask has regions set to divide all light beams into a plurality of groups and makes a different phase shift occur in each region for the light.

Hereinafter, an operation of the phase shift mask will be described.

FIGS. 2A and 2B show the relationship between the amplitude distribution on a lens surface and the amplitude distribution on a focal plane. FIG. 2A shows the position of the focal plane of the lens surface, and FIG. 2B shows the amplitude distribution on the focal plane of the amplitude distribution of the lens surface.

Generally, the principle of condensing using a lens may be described as the Fourier transform equation F shown by the following expressions (1) and (2).

$$\psi(x', y') = \frac{j}{\lambda f} \exp\left[-jk_0\left(f + \frac{x'^2 + y'^2}{2f}\right)\right] \times F[\psi(x, y)] \quad (1)$$

$$F[\psi(x, y)] = \int\int_{-\infty}^{\infty} \psi(x, y) \exp\left[jk_0 \frac{x'x + y'y}{f}\right] dx dy \quad (2)$$

In the expressions (1) and (2), $\psi(x', y')$ is the amplitude distribution on the spot surface, and $\psi(x, y)$ is the amplitude distribution on the lens surface. $\lambda$ is a wavelength of light, f is a focal distance of a lens, and k0 is a wave number.

However, this is an approximation. Assuming that the condensing spot system on the x'y' plane is D, it is important that the Fraunhofer approximation shown by the following expression (3) is satisfied.

$$\frac{D^2}{f\lambda} \ll 1 \quad (3)$$

This principle indicates that the condensed spot is a Fourier transform of the amplitude distribution on the lens surface.

Using this principle, the spot distribution (beam pattern) at the focal point can be changed on the basis of the Fourier transform rule by changing the amplitude distribution on the lens surface (far-field image) with a phase shift mask conversely.

The phase shift mask 3 is disposed in a far-field region (non-focal point) of the incident light L. In consideration of the tolerance, it is preferable that the phase shift mask 3 is disposed in a location where the luminous flux diameter is large.

For example, the phase shift mask 3 is disposed between the sensor unit 1 and the lens module 2.

Alternatively, the phase shift mask 3 may be provided in the lens module 2.

Figure 3A:
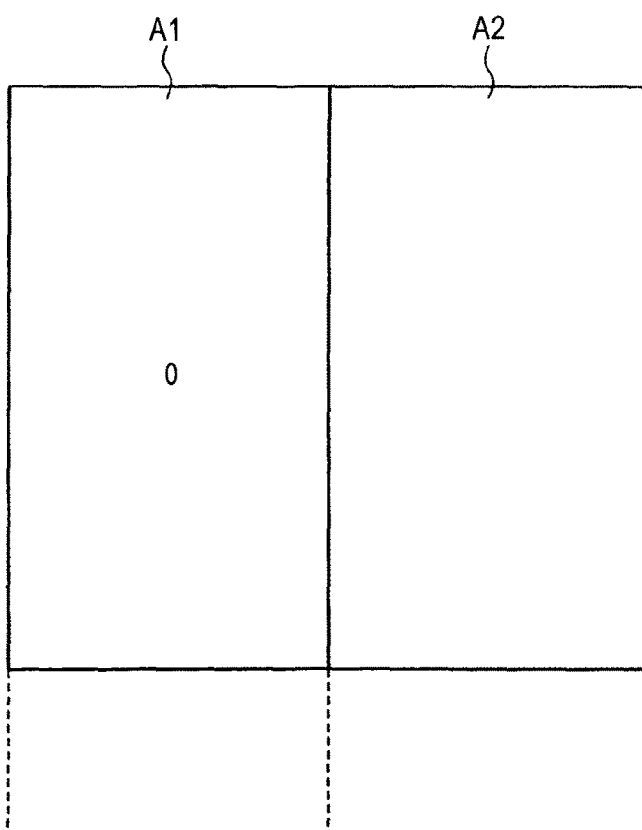
FIG. 3A is a plan view showing a specific example of a phase shift mask in the first embodiment of the present invention.
Figure 3B:
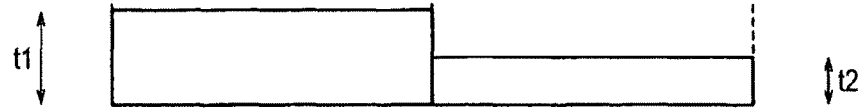
FIG. 3B is a sectional view of FIG. 3A.

FIG. 3A is a plan view showing a specific example of a phase shift mask, and FIG. 3B is a sectional view of FIG. 3A.

The phase shift mask shown in FIGS. 3A and 3B has regions set to divide all light beams into two groups and makes a phase shift of 0 occur in one region A1 and a phase shift of $\pi$ occur in the other region A2 for the light.

In order to make the phase shift occur, for example, it is preferable to provide a level difference between the two regions with the thicknesses of a mask in the two regions A1 and A2 as t1 and t2, respectively.

The phase difference which occurs due to the level differences is expressed as the following expression (4).

$$\frac{(n-1)(t_1 - t_2)}{\lambda} \quad (4)$$

In the expression (4), n is a refractive index of a material used to form the phase shift mask, t1-t2 is a level difference, and $\lambda$ is a wavelength of light.

Here, it is assumed that the F number of an inserted section is sufficiently large and beams transmitted therethrough are parallel beams. In order to make a phase shift of 0 occur in one region A1 and a phase shift of $\pi$ occur in the other region A2, it is preferable to set n, t1, and t2 such that the value of the expression (4) is set to ½.

As can be seen from the expression (4), the phase difference which occurs due to the level difference (t1-t2) is in inverse proportion to the wavelength $\lambda$. Accordingly, if the wavelength changes, a phase difference occurring as a result also changes.

Figure 4:
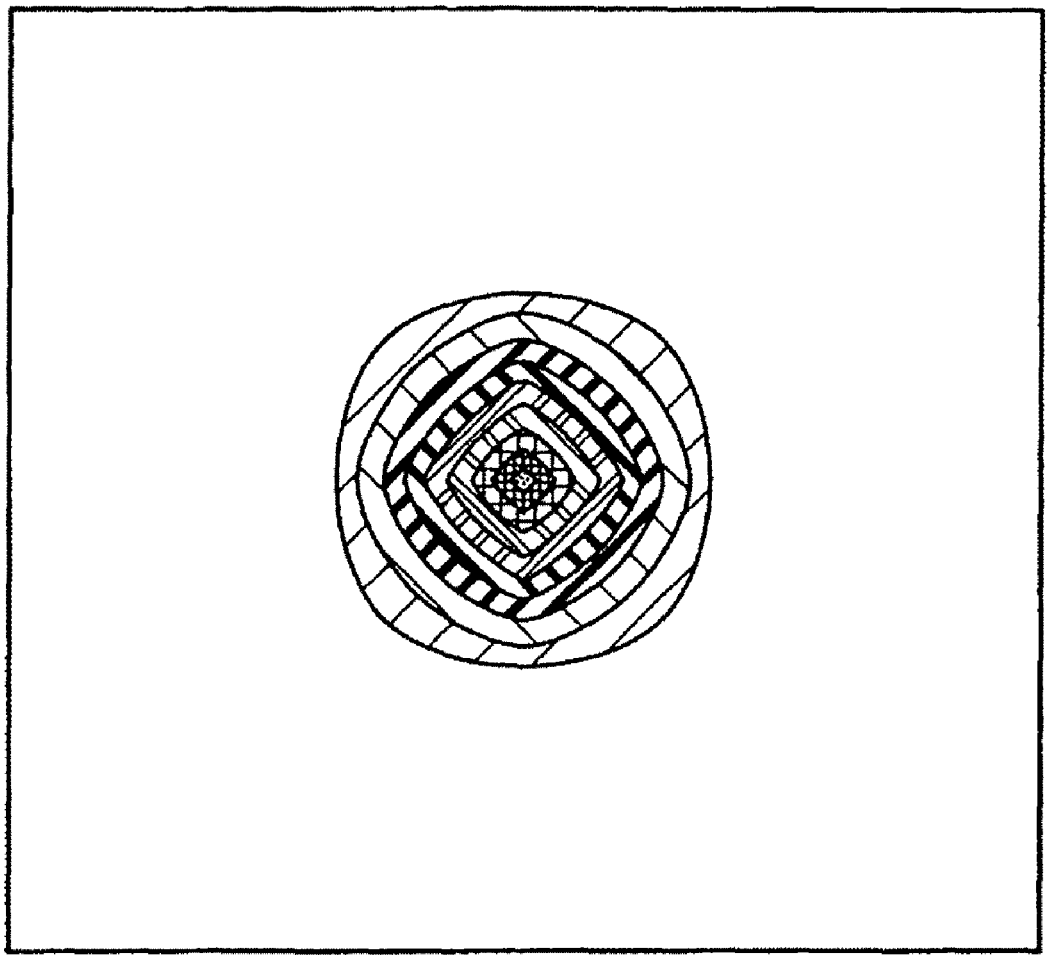
FIG. 4 is a view showing a beam pattern on a light receiving surface which connects focal points when condensing light with a wavelength whose amplitude distribution on a lens is constant.

FIG. 4 shows a beam pattern on the light receiving surface which connects focal points when condensing beams with a lens in which the amplitude distribution $\psi(x, y)$ on the lens is constant and which has NA of 0.3 at a wavelength of 550 nm (green light).

This beam pattern is circular and is called an Airy disc. FIG. 4 shows a shape close to this spot distribution in normal condensing.

Figure 5B:
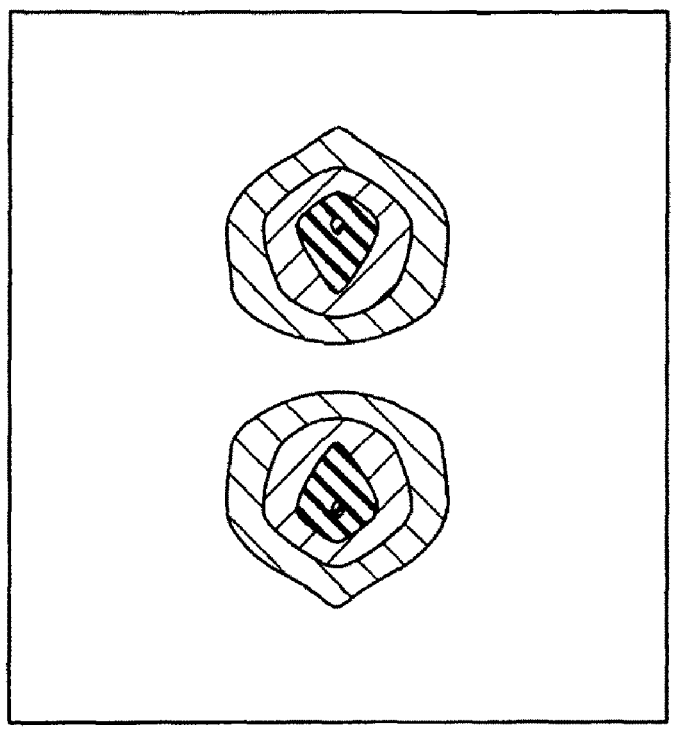
FIG. 5B is a view showing a result of the beam pattern using simulation.
Figure 5A:
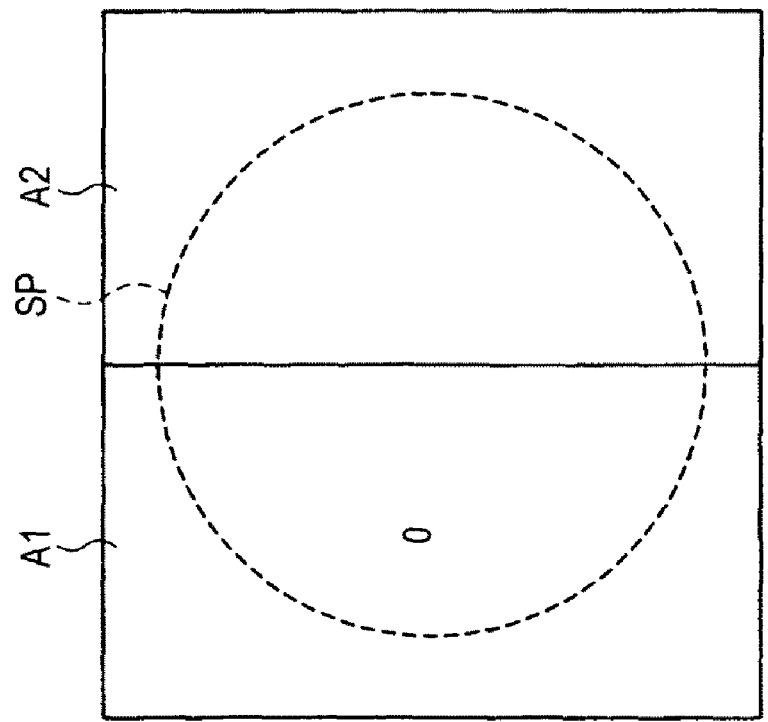
FIG. 5A is a plan view showing a specific example of the phase shift mask.

FIG. 5A is a plan view showing a specific example of a phase shift mask. In addition, FIG. 5B shows a result of a beam pattern on the light receiving surface which connects focal points when the phase shift mask shown in FIG. 5A is used, the result being based on the simulation in which condensing is performed by a lens which has NA of 0.3 at a wavelength of 550 nm (green).

As shown in FIG. 5A, a phase shift of 0 occurs in one region A1 and a phase shift of $\pi$ occurs in the other region A2, a spot SP is a spot of incident light, and the phase shift mask is disposed in a far-field region.

As shown in FIG. 5B, a symmetrical pattern which spread in the division direction was obtained as the beam pattern on the light receiving surface.

Figure 6B:
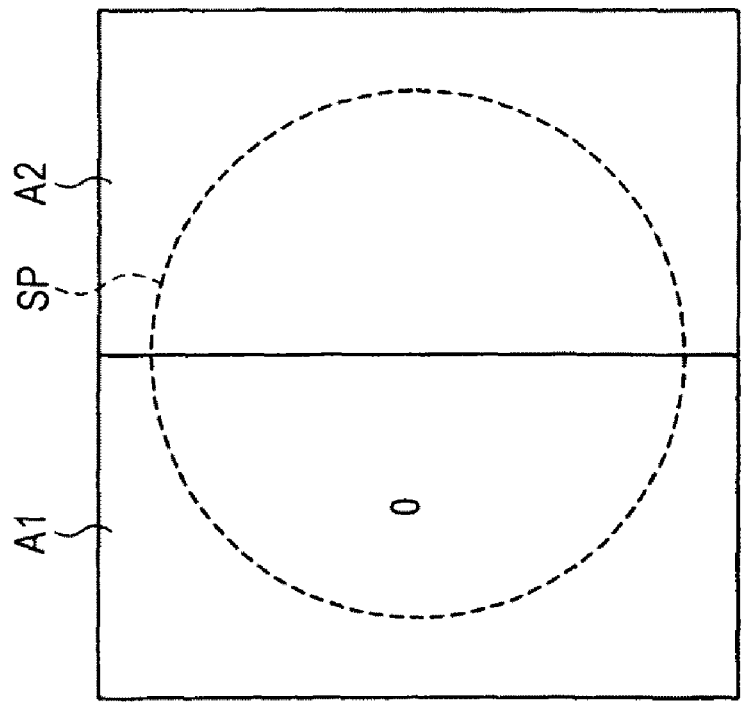
FIG. 6B is a view showing a result of the beam pattern using simulation.
Figure 6A:
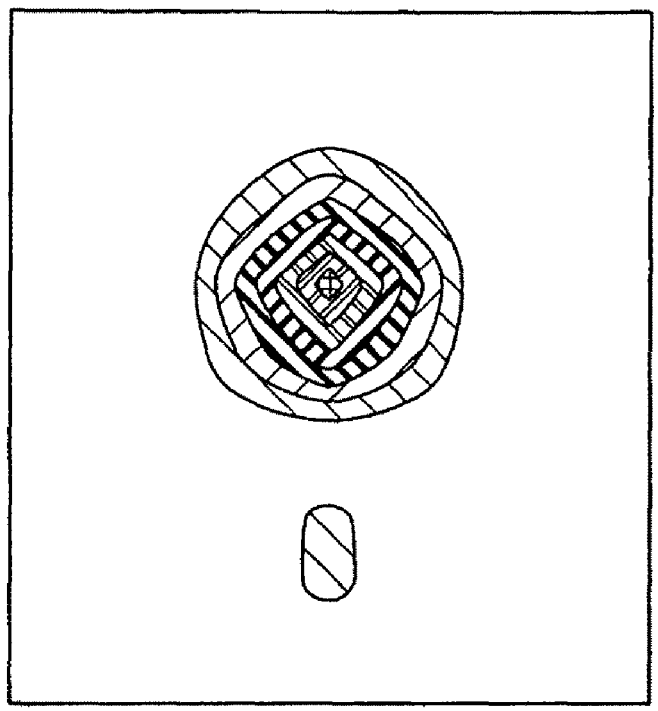
FIG. 6A is a plan view showing a specific example of the phase shift mask.

In addition, FIG. 6A is a plan view showing a specific example of a phase shift mask. In addition, FIG. 6B shows a result of a beam pattern on the light receiving surface, on which the focal point is formed, when the phase shift mask shown in FIG. 6A is used, the result being based on the simulation in which condensing is performed by a lens which has NA of 0.3 at a wavelength of 550 nm (green).

As shown in FIG. 6A, a phase shift of 0 occurs in one region A1 and a phase shift of $\pi/2$ occurs in the other region A2, a spot SP is a spot of incident light, and the phase shift mask is disposed in a far-field region.

As shown in FIG. 6B, the beam pattern on the light receiving surface was an asymmetrical pattern which spread in the division direction. Particularly, the beam pattern on the light receiving surface was a pattern deflected to the region A2 with a phase difference of $\pi/2$.

Figure 7B:
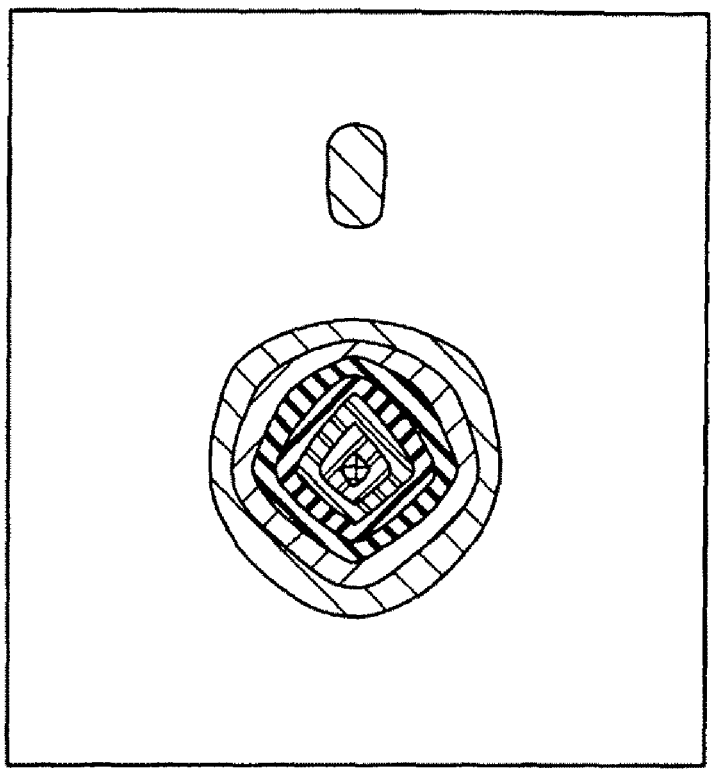
FIG. 7B is a view showing a result of the beam pattern using simulation.
Figure 7A:
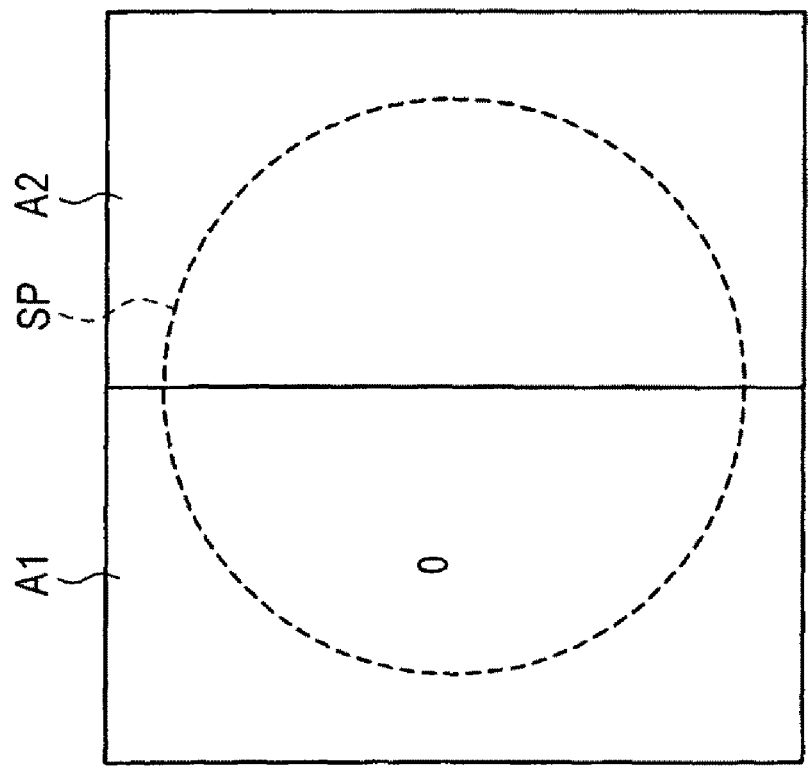
FIG. 7A is a plan view showing a specific example of the phase shift mask.

In addition, FIG. 7A is a plan view showing a specific example of a phase shift mask. In addition, FIG. 7B shows a result of a beam pattern on the light receiving surface, on which the focal point is formed, when the phase shift mask shown in FIG. 7A is used, the result being based on the simulation in which condensing is performed by a lens which has NA of 0.3 at a wavelength of 550 nm (green).

As shown in FIG. 7A, a phase shift of 0 occurs in one region A1 and a phase shift of $-\pi/2$ occurs in the other region A2, a spot SP is a spot of incident light, and the phase shift mask is disposed in a far-field region.

As shown in FIG. 7B, the beam pattern on the light receiving surface was an asymmetrical pattern which spread in the division direction. Particularly, the beam pattern on the light receiving surface was a pattern deflected to the region A1 with a phase difference of 0.

Using these characteristics, it is possible to form a spot pattern which is optimal for each of the three colors of green, blue, and red.

According to the solid state imaging device of the present embodiment, the beam pattern on the light receiving surface can be changed according to the wavelength of incident light by providing the phase shift mask. Accordingly, crosstalk occurring when incident light is defocused can be suppressed.

Second Embodiment

Figure 8:
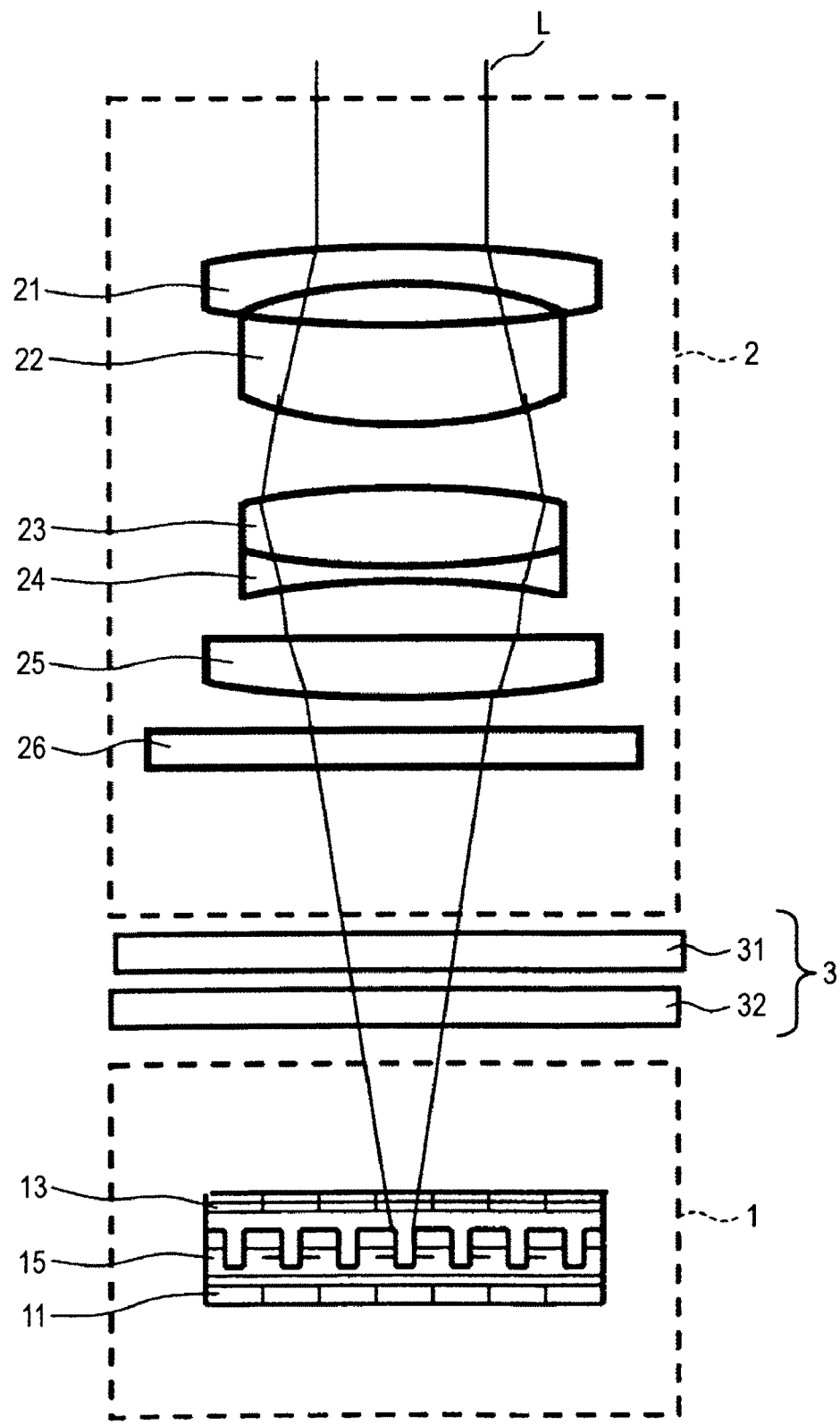
FIG. 8 is a view showing the schematic configuration of a solid state imaging device according to a second embodiment of the present embodiment.

FIG. 8 is a view showing the schematic configuration of a solid state imaging device according to the present embodiment.

For example, the solid state imaging device includes a sensor unit 1, a lens module 2, and a phase shift mask 3 disposed between the sensor unit 1 and the lens module 2.

The phase shift mask 3 includes a plurality of masks of first and second masks 31 and 32. Since the amount of phase shift is in inverse proportion to the wavelength from the expression (3), the phase can be changed by using the wavelength.

For example, the sensor unit 1 has an insulating layer 15 formed on the semiconductor substrate 11 in which CMOS or CCD type pixels including photodiodes are disposed in an array. A metal wiring line, an optical waveguide, and the like are provided in the insulating layer 15. A color filter 13 and the like are formed on the insulating layer 15. Although the configuration of the sensor unit 1 shown in FIG. 8 is different from that in the first embodiment, the sensor unit 1 shown in FIG. 8 may be substantially the same sensor unit as in the first embodiment.

Moreover, the lens module 2 may also be the same lens module as in the first embodiment.

Hereinafter, the phase shift mask in the present embodiment will be described in detail.

Figure 9A:
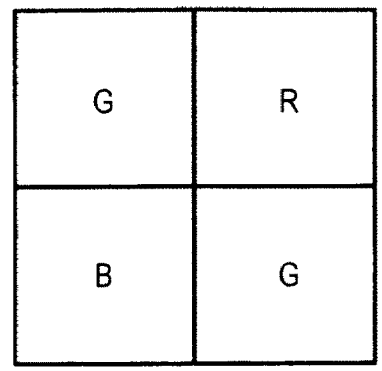
FIG. 9A is a view showing an example of the layout of pixels.

FIG. 9A shows an example of the layout of pixels seen from the light incidence side (color filter side) of the sensor unit 1.

For example, as shown in the drawing, "2×2" pixels are set as one pixel unit PU, and two green (G) pixels are disposed in one diagonal direction and one red (R) pixel and one blue (B) pixel are disposed in the other diagonal direction. The pixel unit with the above configuration including four (2×2) pixels is repeatedly disposed on the light receiving surface.

Figure 9B:
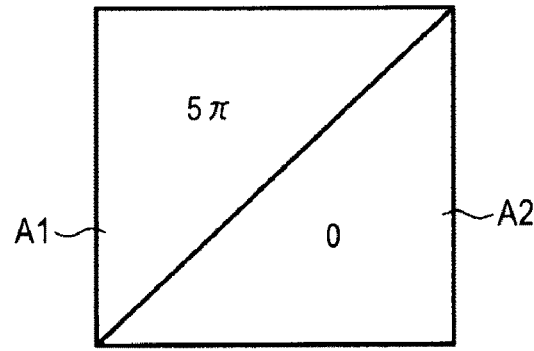
FIG. 9B is a plan view showing a specific example of a first mask.

FIG. 9B is a plan view showing a specific example of the first mask 31.

The first mask is a phase shift mask for green light.

The first mask is a mask which makes a phase difference of an odd multiple of π occur at a wavelength of a green color and a phase difference of an even multiple of π occur at a wavelength of blue and red colors. If the wavelengths of blue, green, and red colors are set to 450 nm, 550 nm, and 650 nm, respectively, the above conditions can be almost realized when forming a level difference equivalent to a phase difference of about 5π at the wavelength of 550 nm.

That is, as shown in FIG. 9B, the first mask 31 has regions set to divide all light beams into two groups and makes a phase shift of 5π occur in one region A1 and a phase shift of 0 occur in the other region A2 for green light (wavelength of 550 nm).

Figure 9C:
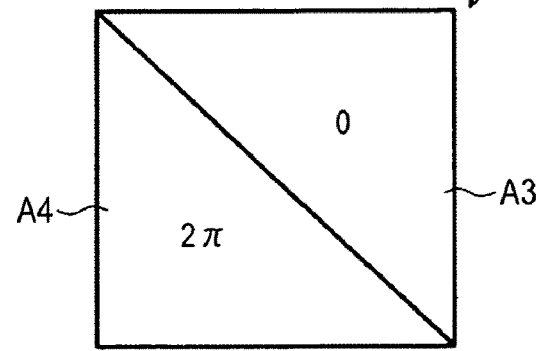
FIG. 9C is a plan view showing a specific example of a second mask.

FIG. 9C is a plan view showing a specific example of the second mask 32.

The second mask is a phase shift mask for blue and red light. Preferably, the phase shift mask corresponding to the wavelength of blue and red colors makes a phase difference of an even multiple of π occur at a wavelength of a green color, a phase difference of (4m+1) times of π/2 occur at a wavelength of a blue color, and a phase difference of (4m−1) times of π/2 occur at a wavelength of a red color (where, m is an integer). In this case, the above conditions can be almost realized when forming a level difference equivalent to a phase difference of about 2π at the wavelength of 550 nm of the green color.

That is, as shown in FIG. 9C, the second mask 32 has regions set to divide all light beams into two groups and makes a phase shift of 0 occur in one region A3 and a phase shift of 2π occur in the other region A4 for the green light (wavelength of 550 nm).

The division line which divides the regions A3 and A4 is perpendicular to the division line which divides the regions A1 and A2.

Figure 9D:
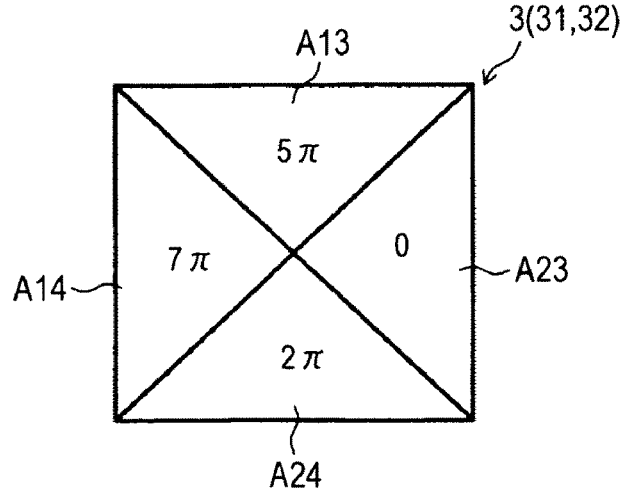
FIG. 9D is a plan view of a phase shift mask obtained by combining the first and second masks.

FIG. 9D is a plan view of a phase shift mask obtained by combining the first and second masks 31 and 32. Division of regions and the phase difference of each region when two masks are combined are shown in FIG. 9D.

That is, for the green light (wavelength of 550 nm), the phase difference is 5π in a region A13 where the regions A1 and A3 overlap each other. In addition, the phase difference is 0 in a region A23 where the regions A2 and A3 overlap each other. In addition, the phase difference is 2π in a region A24 where the regions A2 and A4 overlap each other. In addition, the phase difference is 7π in a region A14 where the regions A1 and A4 overlap each other.

In the phase shift mask 3 formed by combining the first and second masks 31 and 32, regions for dividing all light beams into four groups are set by division lines which are perpendicular to each other and are obtained by rotating division lines, which divide pixels of the pixel unit, by 45° on a plane parallel to the light receiving surface. For green light among all light beams, phase shifts of 0, 2π, 7π, and 5π occur in the clockwise direction from a certain region. Instead of the clockwise direction, the counterclockwise direction may be applied.

Assuming that the wavelengths of blue (B) light, green (G) light, and red (R) light are 450 nm, 550 nm, and 650 nm, respectively, the phase difference which occurs by the phase shift mask 3 formed by combining the first and second masks 31 and 32 is as follows.

FIG. 10A shows an example of the pixel layout. FIGS. 10B to 10D show the phase differences which effectively occur for green (G) light, blue (B) light, and red (R) light, respectively.

That is, for the green (G, 550 nm) light, the phase difference is π in the region A1 and the phase difference is 0 in the region A2.

In addition, for the blue (B, 450 nm) light, the phase difference is π/2 in the region A4 and the phase difference is 0 in the region A3 effectively.

In addition, for the red (R, 650 nm) light, the phase difference is −π/2 in the region A4 and the phase difference is 0 in the region A3 effectively.

FIG. 11A shows a beam pattern on the light receiving surface at a wavelength of 550 nm (green light) when there is no phase shift mask. This beam pattern is circular.

FIG. 11B shows a beam pattern on the light receiving surface at a wavelength of 550 nm (green light) when the above-described phase shift mask is provided.

For the green light, the phase difference shown in FIG. 10B occurred substantially and the beam pattern on the light receiving surface was a symmetrical pattern which spread in the division direction, that is, a pattern was obtained in which light beams were incident on two green pixels.

Figure 12A:
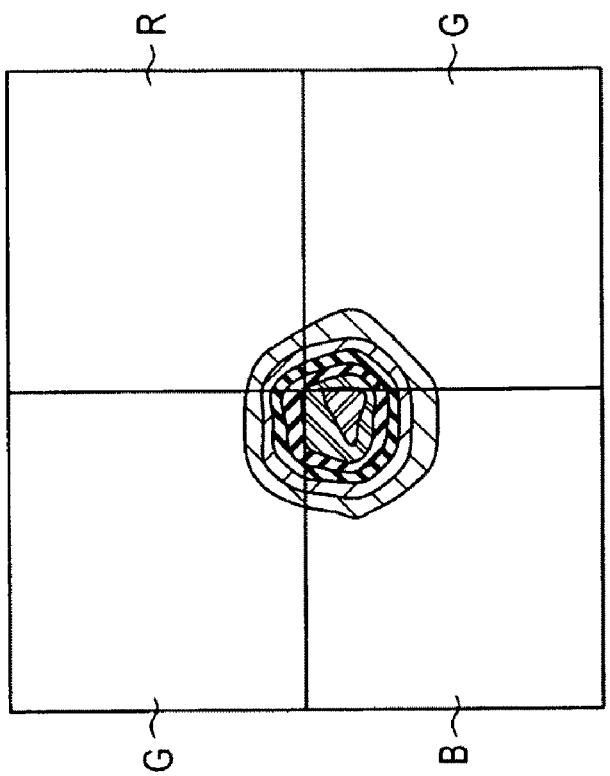
FIG. 12A is a view showing a beam pattern on the light receiving surface at a wavelength of 450 nm (blue light) when there is no phase shift mask.

FIG. 12A shows a beam pattern on the light receiving surface at a wavelength of 450 nm (blue light) when there is no phase shift mask. This beam pattern is circular.

Figure 12B:
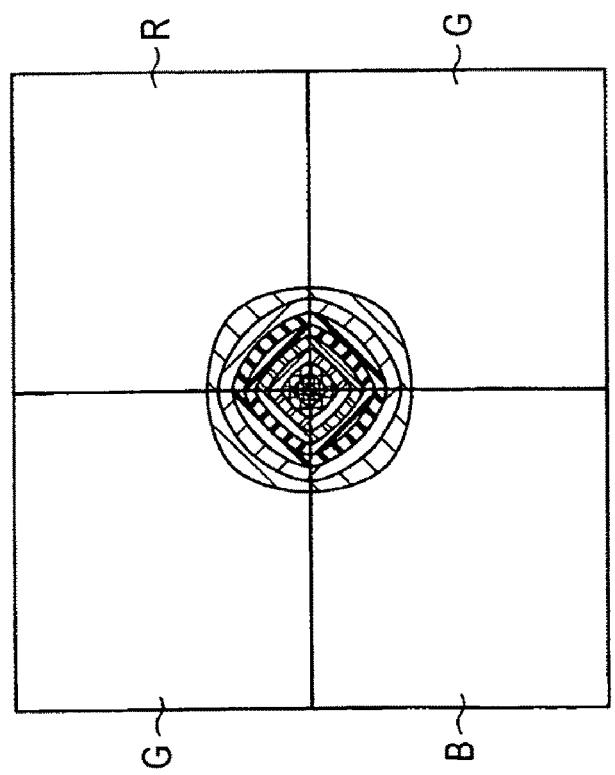
FIG. 12B shows a beam pattern on the light receiving surface at a wavelength of 450 nm (blue light) when a phase shift mask is provided.

FIG. 12B shows a beam pattern on the light receiving surface at a wavelength of 450 nm (blue light) when the above-described phase shift mask is provided.

For the blue light, the phase difference shown in FIG. 10C occurred substantially and the beam pattern on the light receiving surface was an asymmetrical pattern which spread in the division direction. Particularly, the beam pattern on the light receiving surface was a pattern deflected to the region A4 with a phase difference of $\pi/2$. That is, a pattern deflected to a blue pixel was obtained.

FIG. 13A shows a beam pattern on the light receiving surface at a wavelength of 650 nm (red light) when there is no phase shift mask. This beam pattern is circular.

FIG. 13B shows a beam pattern on the light receiving surface at a wavelength of 650 nm (red light) when the above-described phase shift mask is provided.

For the red light, the phase difference shown in FIG. 10D occurred substantially and the beam pattern on the light receiving surface was an asymmetrical pattern which spread in the division direction. Particularly, the beam pattern on the light receiving surface was a pattern deflected to the region A3 with a phase difference of 0. That is, a pattern deflected to the red pixel was obtained.

Moreover, diffraction calculation when the size of each pixel was set to 2 μm square was performed. In this case, a result was obtained in which the amount of light was increased by 48% in green light, 73% in blue light, and 43% in red light compared with that in the case where there was no phase shift plate.

Since actual illumination light is not limited to having only the three wavelengths as assumed herein and the wavelength is continuously distributed, the amount of increase is smaller than that described above. However, it is thought that predetermined effects can be acquired on the basis of those described above.

The suppression of crosstalk occurring when incident light is defocused, which can be realized by changing the beam pattern on the light receiving surface according to the wavelength of the incident light by providing the phase shift mask, will be described.

FIGS. 14A and 14B, 15A and 15B, 16A and 16B, and 17A and 17B are views for explaining the effects of the solid state imaging device according to the embodiment described above.

Figure 14A:
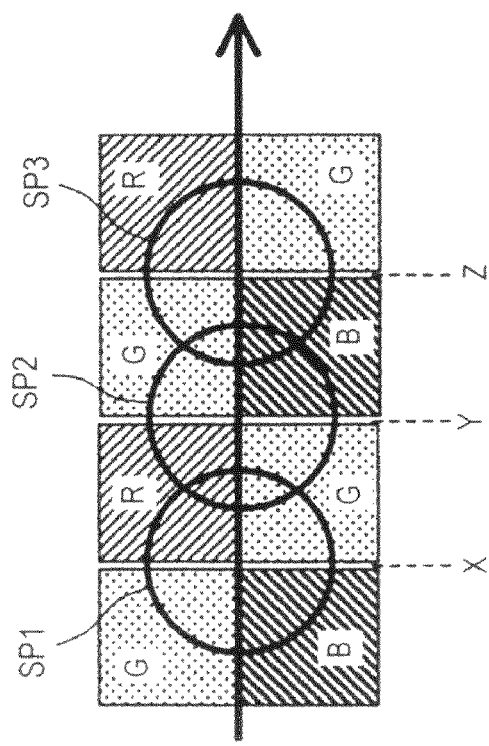
FIGS. 14A and 14B are views for explaining the effects of a second embodiment of the present invention.

FIG. 14A shows the layout in which pixels of green (G), blue (B), and red (R) colors are repeatedly arrayed in the above pattern.

The case is considered in which three spots SP1 to SP3 are incident on the pixels, which are arrayed in the above pattern, on the light receiving surface on which the focal point is formed.

Figure 14B:
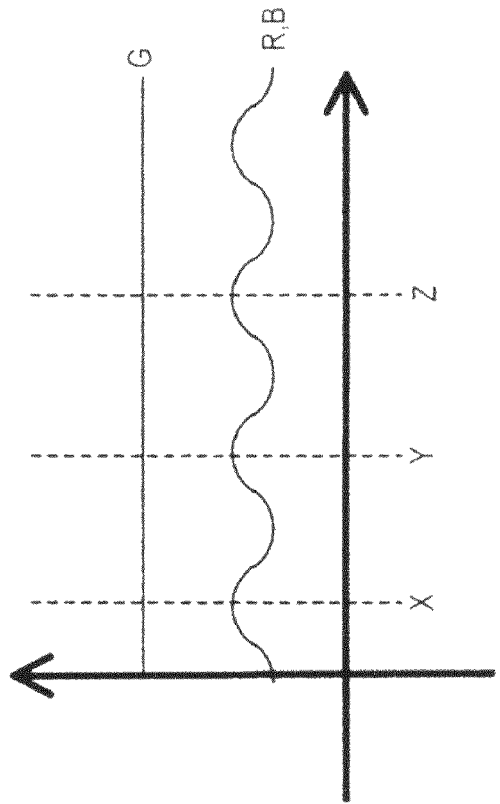

The intensity of light that each of the pixels of green (G), blue (B), and red (R) colors receives at the position indicated by the arrow in FIG. 14A is shown in FIG. 14B.

In the above configuration, when incident light is defocused, the three spots SP1 to SP3 with a pattern shown in FIG. 15A are incident.

The intensity of light that each of the pixels of green (G), blue (B), and red (R) colors receives at the position indicated by the arrow in FIG. 15A is shown in FIG. 15B.

That is, FIG. 15B indicates that the amplitude of the signal intensity of each of the blue (B) and red (R) colors has decreased and crosstalk CT between pixels has occurred.

Next, the case of the present embodiment will be described.

Figure 16A:
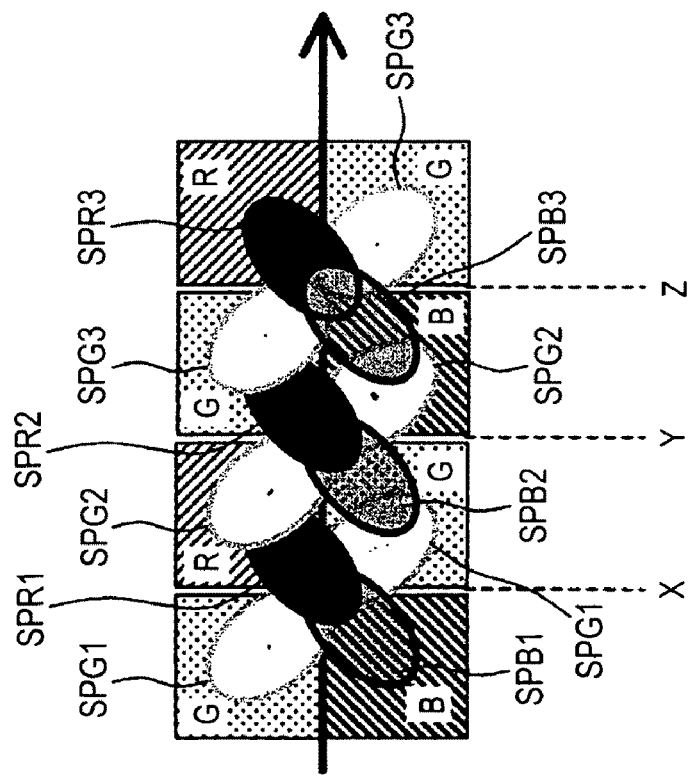
FIGS. 16A and 16B are views for explaining the effects of the second embodiment of the present invention.

FIG. 16A shows the layout in which pixels of green (G), blue (B), and red (R) colors are repeatedly arrayed in the above pattern.

In the present embodiment, three spots SPG1 to SPG3 of green light each of which is divided into two parts, three spots SPB1 to SPB3 of blue light, and three spots SPR1 to SPR3 of red light are incident on the light receiving surface on which the focal point is formed.

Figure 16B:
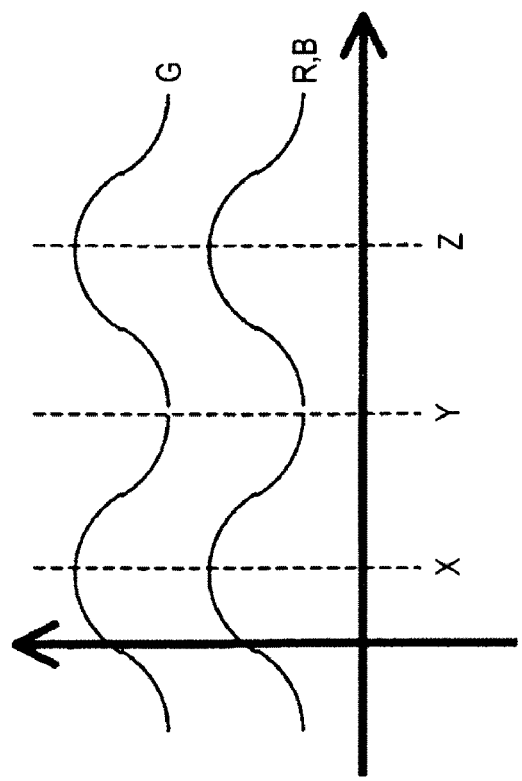

The intensity of light that each of the pixels of green (G), blue (B), and red (R) colors receives at the position indicated by the arrow in FIG. 16A is shown in FIG. 16B.

Figure 17A:
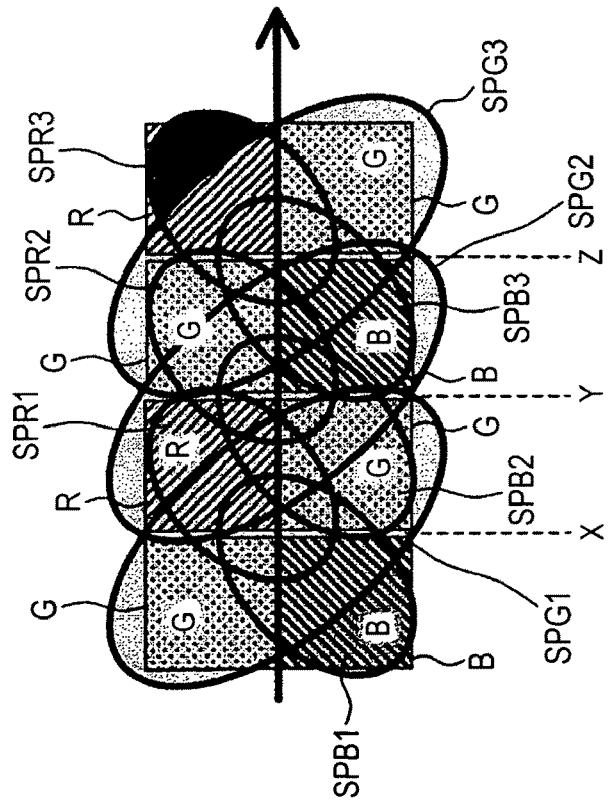
FIGS. 17A and 17B are views for explaining the effects of the second embodiment of the present invention.

When the incident light is defocused in the above situation, a state is obtained in which three spots SPG1 to SPG3 of green light, three spots SPB1 to SPB3 of blue light, and three spots SPR1 to SPB3 of red light are incident as shown in FIG. 17A.

Figure 17B:
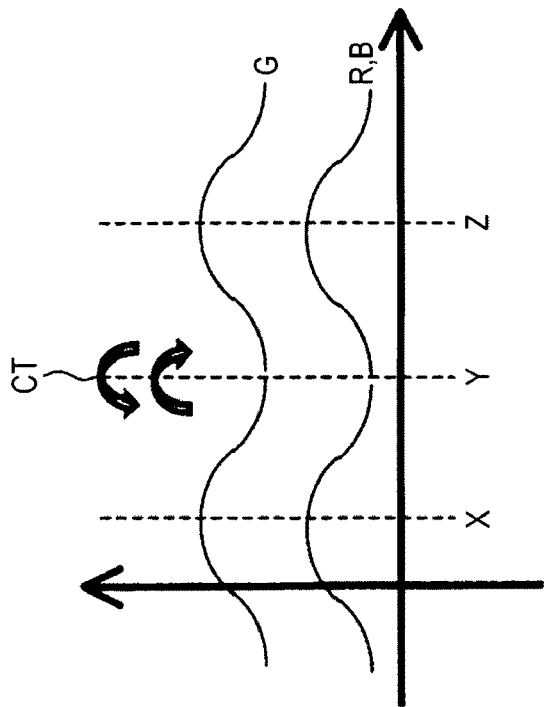

The intensity of light that each of the pixels of green (G), blue (B), and red (R) colors receives at the position indicated by the arrow in FIG. 17A is shown in FIG. 17B.

That is, FIG. 17B indicates that the amplitude of the signal intensity of each of the green (G), blue (B), and red (R) colors has not decreased and the crosstalk CT between pixels has been suppressed.

Third Embodiment

Figure 18:
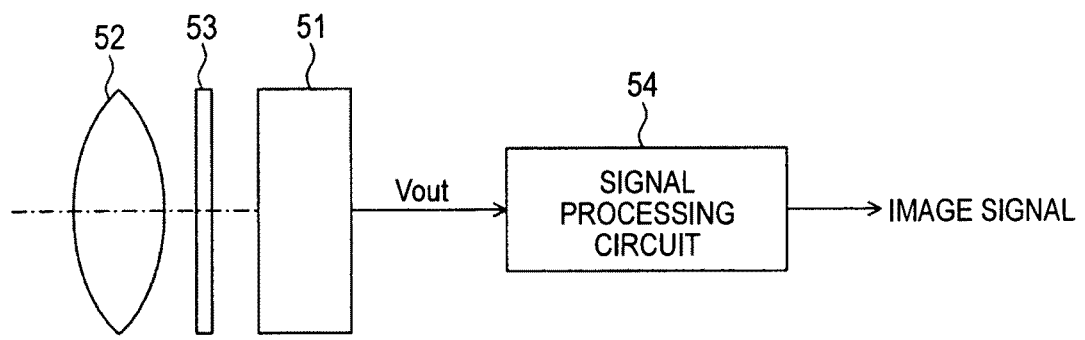
FIG. 18 is a view showing the schematic configuration of a camera which is an electronic apparatus according to a third embodiment of the present invention.
Figure 19:
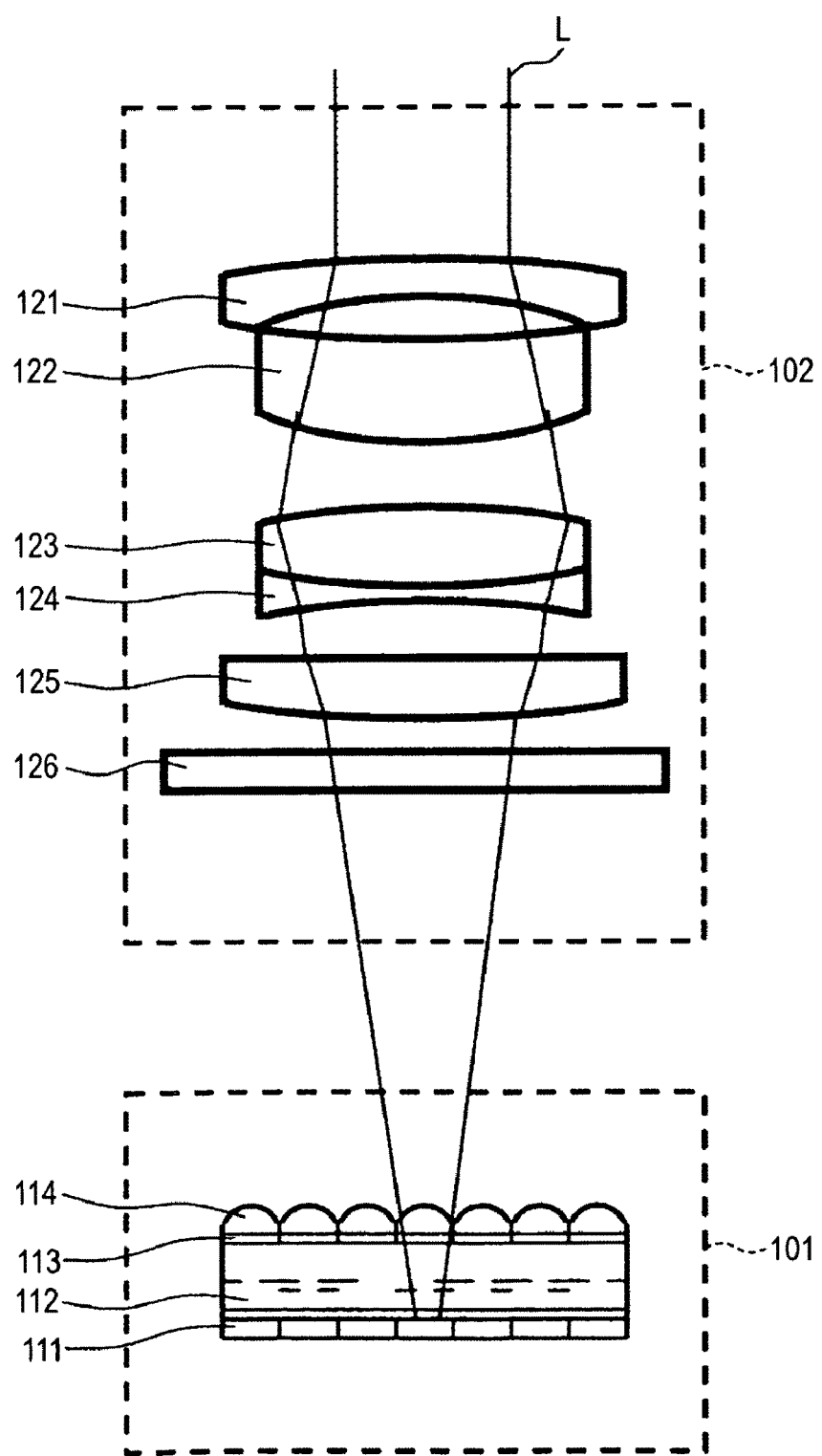
FIG. 19 is a view showing the schematic configuration of an example of a solid state imaging device in the related art.
Figure 20:
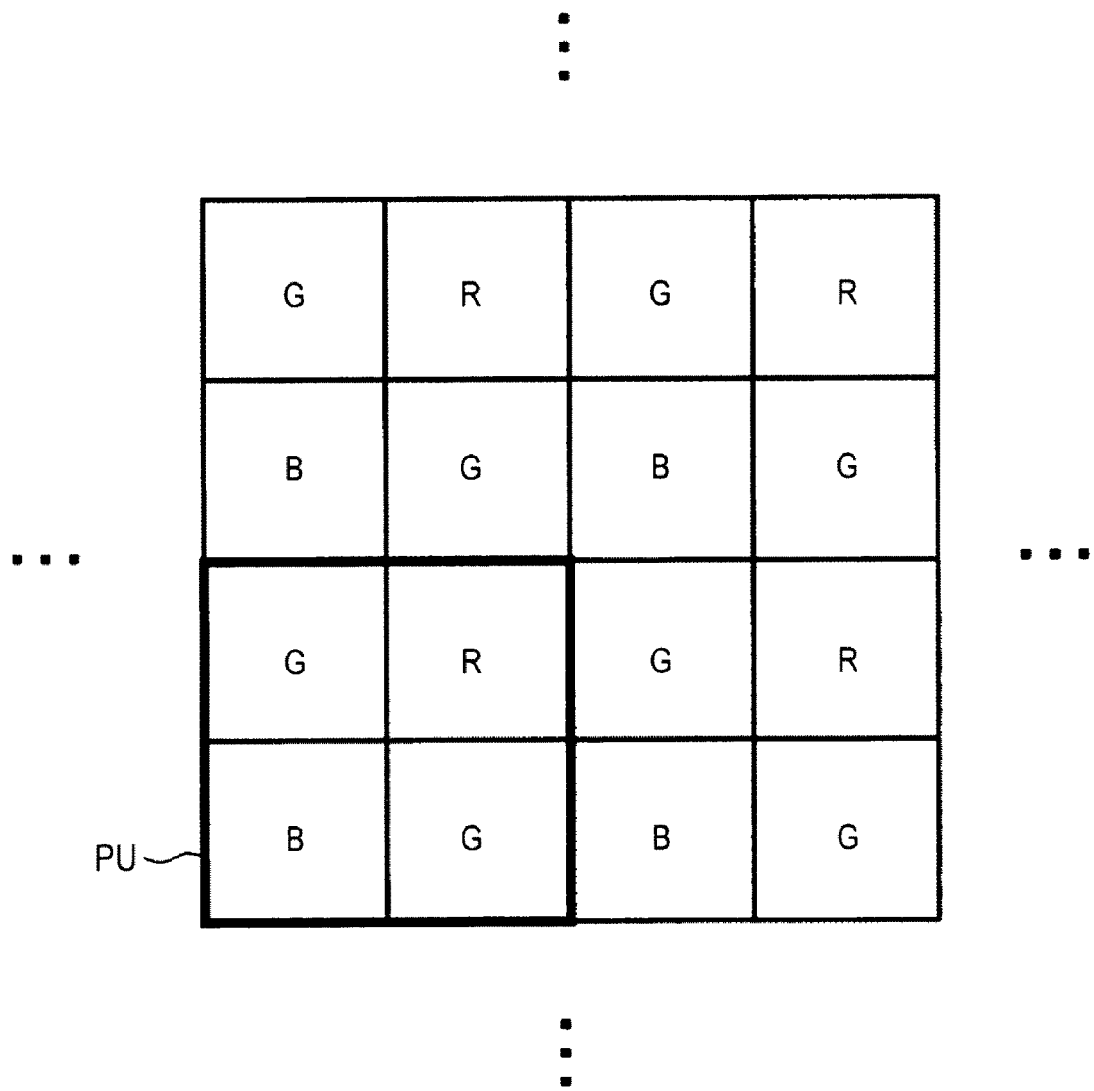
FIG. 20 is a view showing an example of the layout of pixels in the related art.

FIG. 18 is a view showing the schematic configuration of a camera which is an electronic apparatus according to the present embodiment. The camera according to the present embodiment is an example of a video camera capable of photographing a still image or a moving image.

The camera according to the present embodiment includes a sensor unit 51, an optical system 52 having a lens module, a phase shift mask 53, a signal processing circuit 54, and the like. The phase shift mask 53 may be provided in the optical system 52.

In the present embodiment, the sensor unit 51, the lens module, and the phase shift mask 53 have the same configuration as those in the solid state imaging devices according to the first and second embodiments.

The optical system 52 forms image light (incident light) from a subject on the imaging surface of the sensor unit 51.

Then, a signal charge is accumulated in the sensor unit 51 during a predetermined period. The accumulated signal charge is output as an output signal Vout.

A shutter device controls the light illumination period and the light blocking period with respect to the sensor unit 51.

An image processor supplies a driving signal for controlling a transfer operation of the sensor unit 51 and a shutter operation of the shutter device. The signal transfer of the sensor unit 51 is performed by the driving signal (timing signal) supplied from the image processor. The signal processing circuit 54 performs various kinds of signal processing on the output signal Vout of the sensor unit 51 and outputs it as an image signal. The image signal after the signal processing is stored in a storage medium, such as a memory, or is output to a monitor.

According to the electronic apparatus of the present embodiment, crosstalk occurring when incident light is defocused can be suppressed in the solid state imaging device provided therein.

For example, deterioration of the quality of an image caused by the crosstalk can be suppressed by adopting the present invention for an imaging device in which defocusing easily occurs, such as a fixed focus camera.

The present invention is not limited to being applied to the solid state imaging device which detects the distribution of the incident light amount of visible light and images it as an image. The present invention may also be applied to a solid state imaging device which images the distribution of the incidence amount of infrared ray, X ray, or particles as an image. In a broad sense, the present invention may be applied to every solid state imaging device (physical quantity distribution detecting device), such as a fingerprint detection sensor which detects the distribution of other physical quantity, such as pressure and capacitance, and images it as an image.

In addition, the present invention is not limited to being applied to the solid state imaging device which sequentially scans unit pixels of a pixel array portion in the row unit and reads a pixel signal from each of the unit pixels, and may be applied to an X-Y address type solid state imaging device which selects an arbitrary pixel in the pixel unit and reads a signal from the selected pixel in the pixel unit.

In addition, the solid state imaging device may be formed as one chip or may be formed as a module type device in which an imaging unit and a signal processor or an optical system are collectively packaged and which has an imaging function.

In addition, the present invention is not limited to being applied to the solid state imaging device and may also be applied to an imaging device. Here, the imaging device refers to an electronic apparatus which has an imaging function like a camera system, such as a digital still camera or a video camera, a mobile phone, and the like. In addition, the module type device mounted in an electronic apparatus, that is, a camera module may be used as an imaging device.

In an imaging device, such as a camera module for mobile devices including a video camera, a digital still camera, and a mobile phone, a satisfactory image can be obtained with a simple configuration by using the solid state imaging device according to the above embodiment as a solid state imaging device.

The present invention is not limited to those described above.

For example, the above-described embodiment may be applied to both a CMOS sensor and a CCD device.

In addition, the configuration of a phase shift mask is not particularly limited as long as the phase difference occurs as described above, and various materials may be used and various layer thicknesses may be set.

In addition, various modifications may be made within the scope without departing from the subject matter of the present invention.

What is claimed is:

1. A solid state imaging device comprising:
   a sensor unit that has a semiconductor substrate in which pixels including photoelectric conversion parts are disposed in an array on a light receiving surface;
   a lens module which has a plurality of optical members including a lens and which is disposed such that light including information on an image to be imaged is incident on the light receiving surface of the sensor unit; and
   a phase shift mask in which regions for dividing all light beams into a plurality of groups are set and which makes a different phase shift occur in each of the regions for the light.

2. The solid state imaging device according to claim 1, wherein the phase shift mask is disposed in a far-field region which is a non-focal region of the light.

3. The solid state imaging device according to claim 1, wherein the phase shift mask is provided in the lens module.

4. The solid state imaging device according to claim 1, wherein the phase shift mask has regions set to divide all light beams into two groups and makes a phase shift of 0 occur in one region and a phase shift of $\pi$ occur in the other region for the light.

5. The solid state imaging device according to claim 1, wherein the phase shift mask has regions set to divide all light beams into two groups and makes a phase shift of 0 occur in one region and a phase shift of $\frac{1}{2}\pi$ or $-\frac{1}{2}\pi$ occur in the other region for the light.

6. The solid state imaging device according to any one of claims 1 to 5,
   wherein the sensor unit further has an insulating layer formed on the semiconductor substrate, a wiring line and an optical waveguide formed in the insulating layer, a color filter formed on the insulating layer, and an on-chip microlens formed on the color filter.

7. The solid state imaging device according to claim 6, wherein in the sensor unit, a pixel unit of four (2×2) pixels which includes green pixels having two green color filters in one diagonal direction and which includes a red pixel having a red color filter and a blue pixel having a blue color filter in the other diagonal direction is repeatedly disposed on the light receiving surface, and
   the phase shift mask has regions set to divide all light beams into four groups by division lines, which are perpendicular to each other and are obtained by rotating division lines for dividing the pixels of the pixel unit by 45° on a plane parallel to the light receiving surface, and makes phase shifts of 0, $2\pi$, $7\pi$, and $5\pi$ occur in a clockwise or counterclockwise direction from a certain region for green light among the light beams.

8. An electronic apparatus comprising:
   a sensor unit that has a semiconductor substrate in which pixels including photoelectric conversion parts are disposed in an array on a light receiving surface;
   an optical system including a lens module, which has a plurality of optical members including a lens and which is disposed such that light including information on an image to be imaged is incident on the light receiving surface of the sensor unit, and a phase shift mask in which regions for dividing all light beams into a plurality of groups are set and which makes a different phase shift occur in each of the regions for the light; and
   a signal processing circuit which processes an output signal of the sensor unit.

* * * * *